United States Patent
Koizumi

(10) Patent No.: US 10,181,603 B2
(45) Date of Patent: Jan. 15, 2019

(54) MANUFACTURING METHOD OF SEPARATOR FOR FUEL CELL

(71) Applicant: TOYOTA JIDOSHA KABUSHIKI KAISHA, Toyota-shi, Aichi-ken (JP)

(72) Inventor: Masafumi Koizumi, Nagoya (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 0 days.

(21) Appl. No.: 14/855,544

(22) Filed: Sep. 16, 2015

(65) Prior Publication Data

US 2016/0087287 A1    Mar. 24, 2016

(30) Foreign Application Priority Data

Sep. 19, 2014 (JP) .................. 2014-191694

(51) Int. Cl.
| H01M 8/0228 | (2016.01) |
|---|---|
| H01M 8/0206 | (2016.01) |
| H01M 8/0213 | (2016.01) |
| H01M 8/0215 | (2016.01) |
| C23C 16/26 | (2006.01) |
| C23C 16/02 | (2006.01) |
| H01M 8/1018 | (2016.01) |

(52) U.S. Cl.
CPC ....... *H01M 8/0228* (2013.01); *H01M 8/0206* (2013.01); *H01M 8/0213* (2013.01); *H01M 8/0215* (2013.01); *C23C 16/0245* (2013.01); *C23C 16/26* (2013.01); *H01M 2008/1095* (2013.01); *Y02P 70/56* (2015.11)

(58) Field of Classification Search
CPC .......................... C23C 16/26–16/279
See application file for complete search history.

(56) References Cited

U.S. PATENT DOCUMENTS

| 4,525,381 A * | 6/1985 | Tanaka ................ C23C 16/482 118/50.1 |
|---|---|---|
| 5,908,671 A * | 6/1999 | Tanaka ................. C23C 8/80 427/122 |
| 7,150,918 B2 * | 12/2006 | Brady ................. H01M 8/0204 427/115 |
| 2004/0170881 A1 | 9/2004 | Nakata |
| 2005/0191504 A1 | 9/2005 | Brady |
| 2008/0160390 A1 | 7/2008 | Nakata |
| 2009/0130325 A1 | 5/2009 | Hirakuri et al. |
| 2009/0211667 A1 | 8/2009 | Suzuki et al. |
| 2009/0214927 A1 | 8/2009 | Dadheech et al. |
| 2010/0151358 A1 * | 6/2010 | Sato .................. C23C 14/16 429/514 |
| 2011/0177430 A1 | 7/2011 | Takahashi et al. |
| 2012/0088185 A1 | 4/2012 | Maeda et al. |
| 2012/0231374 A1 | 9/2012 | Iseki et al. |
| 2013/0302719 A1 | 11/2013 | Takada et al. |
| 2014/0093639 A1 | 4/2014 | Schlag et al. |
| 2014/0356764 A1 | 12/2014 | Iseki et al. |
| 2015/0171434 A1 | 6/2015 | Suzuki et al. |
| 2016/0281216 A1 * | 9/2016 | Shibusawa .......... C23C 16/0272 |
| 2016/0301087 A1 * | 10/2016 | Koizumi ............ H01M 8/0228 |

FOREIGN PATENT DOCUMENTS

| CA | 2 876 276 | 2/2014 |
|---|---|---|
| CN | 101517799 A | 8/2009 |
| CN | 102054993 A | 5/2011 |
| CN | 104471768 A | 3/2015 |
| DE | 103 56 653 A1 | 6/2004 |
| DE | 11 2006 002 090 T5 | 6/2008 |
| DE | 10 2009 010 279 A1 | 10/2009 |
| DE | 11 2010 004 990 T5 | 3/2013 |
| JP | H11-043770 A | 2/1999 |
| JP | 2001-187346 A | 7/2001 |
| JP | 2002-88465 | 3/2002 |
| JP | 2002-285340 A | 10/2002 |
| JP | 2004-185998 | 7/2004 |
| JP | 2007-100138 | 4/2007 |
| JP | 2006-108687 A | 5/2008 |
| JP | 2009-127059 | 6/2009 |
| JP | 2009-238438 A | 10/2009 |
| JP | 2010-135232 A | 6/2010 |
| JP | 2010-218899 A | 9/2010 |
| JP | 2010-248572 | 11/2010 |
| JP | 2011-162802 A | 8/2011 |
| JP | 4825894 B2 | 11/2011 |
| JP | 2012-26000 | 2/2012 |

(Continued)

OTHER PUBLICATIONS

Popović, D., V. Milosavljević, and S. Daniels. "Practical Sensor for nitrogen in direct current glow discharges." Journal of Applied Physics 102 (2007): 103303-1-1033303-7.*
D. Popovic, et al., "Practical Sensor for Nitrogen in Direct Current Glow Dishcarges," Journal of Applied Physics 102. 103303 (2007).
Office Action issued in U.S. Appl. No. 15/092,920 dated May 17, 2018.
Notice of Allowance issued in U.S. Appl. No. 15/092,920 dated Sep. 20, 2018.
Corrected Notice of Allowability issued in U.S. Appl. No. 15/092,920 dated Oct. 23, 2018.

*Primary Examiner* — Laura Edwards
*Assistant Examiner* — Jose Hernandez-Diaz
(74) *Attorney, Agent, or Firm* — Finnegan, Henderson, Farabow, Garrett & Dunner, LLP

(57) ABSTRACT

A manufacturing method of a separator for a fuel cell is a method for forming a carbon coating film on a titanium substrate, which has a titanium oxide layer on a surface of the titanium substrate, by CVD. The method includes a step of making a state in which the titanium substrate, which has the titanium oxide layer on the surface of the titanium substrate, is placed into a vacuum atmosphere, an irradiation step of irradiating a surface of the titanium oxide layer of the titanium substrate with light having a wavelength of equal to or shorter than 390 nm before the carbon coating film is formed or while the carbon coating film is being formed, and a step of forming the carbon coating film on the surface of the titanium oxide layer that is irradiated with light in the irradiation step.

8 Claims, 5 Drawing Sheets

(56) References Cited

FOREIGN PATENT DOCUMENTS

| | | | |
|---|---|---|---|
| JP | 2012-104229 | A | 5/2012 |
| JP | 2013-155406 | A | 8/2013 |
| JP | 2015-232937 | A | 12/2015 |
| KR | 10-2009-0052886 | A | 5/2009 |

* cited by examiner

FIG. 6

|  | PROPORTION OF PEELED AREA | RATE OF RESISTANCE INCREASE |
|---|---|---|
| A | EQUAL TO OR LESS THAN 1% | EQUAL TO R LESS THAN 20% |
| B | EQUAL TO OR LESS THAN 5% | ↑ |
| C | EQUAL TO OR LESS THAN 20% | ↑ |
| D | OTHER THAN THE ABOVE | OTHER THAN THE ABOVE |

LEGEND
A: VERY GOOD
B: GOOD
C: AVERAGE
D: POOR

FIG. 7

| | SUBSTRATE | BIAS VOLTAGE | GAS SPECIES FOR BOMBARDMENT | Ar/N FLOW RATE OF GAS FOR BOMBARDMENT | MAXIMUM TEMPERATURE AT THE TIME OF BOMBARDING | PRESENCE OR ABSENCE OF N2 GAS DURING FILM FORMATION | RESULT OF ADHESIVENESS EVALUATION |
|---|---|---|---|---|---|---|---|
| COMPARATIVE EXAMPLE 1 | Ti BA MATERIAL | 2.5kV | Ar | 500/0 | 672°C | ABSENT | D |
| COMPARATIVE EXAMPLE 2 | Ti BA MATERIAL | 2.5kV | Ar | 500/0 | 675°C | PRESENT | C |
| COMPARATIVE EXAMPLE 3 | Ti BA MATERIAL | 2.0kV | Ar | 500/0 | 632°C | ABSENT | D |
| COMPARATIVE EXAMPLE 4 | Ti BA MATERIAL | 2.0kV | Ar | 500/0 | 632°C | PRESENT | D |
| COMPARATIVE EXAMPLE 5 | ACID PICKLING MATERIAL | 2.0kV | Ar | 500/0 | 641°C | PRESENT | D |
| EXAMPLE 1 | Ti BA MATERIAL | 2.5kV | Ar+N2 | 500/50 | 665°C | ABSENT | B |
| EXAMPLE 2 | Ti BA MATERIAL | 2.5kV | Ar+N2 | 500/50 | 663°C | PRESENT | B |
| EXAMPLE 3 | Ti BA MATERIAL | 2.5kV | Ar+N2 | 250/250 | 645°C | PRESENT | A |
| EXAMPLE 4 | Ti BA MATERIAL | 2.0kV | Ar+N2 | 500/50 | 626°C | PRESENT | B |
| EXAMPLE 5 | Ti BA MATERIAL | 2.0kV | Ar+N2 | 250/250 | 619°C | PRESENT | A |
| EXAMPLE 6 | ACID PICKLING MATERIAL | 2.0kV | Ar+N2 | 250/250 | 623°C | PRESENT | B |
| EXAMPLE 7 | Ti ANATASE TYPE | 2.5kV | Ar+N2 | 500/50 | 619°C | PRESENT | A |

LEGEND  A: VERY GOOD B: GOOD C: AVERAGE D: POOR

MANUFACTURING METHOD OF SEPARATOR FOR FUEL CELL

INCORPORATION BY REFERENCE

The disclosure of Japanese Patent Application No. 2014-191694 filed on Sep. 19, 2014 including the specification, drawings and abstract is incorporated herein by reference in its entirety.

BACKGROUND OF THE INVENTION

1. Field of the Invention

The invention relates to a manufacturing method of a separator for a fuel cell. More specifically, the invention relates to improving a technique of forming a carbon coating film on a titanium substrate, which has a titanium oxide layer on a surface thereof, by CVD (chemical vapor deposition).

2. Description of Related Art

As a surface treatment technique performed at the time of manufacturing a separator for a fuel cell, a technique of coating a substrate with a carbon-based conductive thin film has been developed which replaces a noble metal plating technique that is a technique of the related art using Au or the like.

As a substrate of a separator, SUS, titanium, or the like is used. Particularly, from the viewpoint of having a high degree of corrosion resistance, a titanium substrate is used. Therefore, a technique of coating a separator substrate made of titanium with a carbon thin film is used with increasing frequency.

In a case in which a carbon thin film is formed on the separator substrate made of titanium by using a raw material of hydrocarbon-based gas by means of plasma CVD (chemical vapor deposition using plasma), it is particularly important to ensure adhesion between the substrate and the carbon thin film. However, it is technically very difficult to ensure the adhesion in many cases. That is, although a titanium oxide layer is spontaneously formed on the uppermost layer of the titanium substrate in the atmosphere, the titanium oxide layer is known as an extremely strong and dense film that exhibits low activity. It is considered that, for this reason, it is difficult to accelerate bonding between the titanium oxide layer and the carbon thin film layer.

Therefore, in order to solve the problem of the adhesion between the titanium oxide layer and the carbon thin film layer, a method of forming an intermediate layer between the titanium oxide layer and the carbon thin film layer is used. Specific examples of such a method include a method of forming an intermediate layer, which is composed of one or more kinds of elements selected from metals such as Ti, Zr, Hf, V, Nb, Ta, Cr, Mo, and W or from semimetallic elements such as Si and B, on a titanium oxide layer (an oxide film as a substrate) and forming a carbon thin film layer on the intermediate layer (for example, see Japanese Patent Application Publication No. 2004-185998 (JP 2004-185998 A)).

Furthermore, as another method for solving the problem of the adhesion between the titanium oxide layer and the carbon thin film layer, there is a method of removing the titanium oxide layer from the surface of a titanium substrate and forming a carbon thin film layer on the surface of the titanium substrate.

However, if the intermediate layer is formed to ensure the adhesion between the oxide film as a substrate and the carbon film, the number of steps for manufacturing the separator is increased, and therefore manufacturing costs are increased. In addition, in the case of removing the titanium oxide layer from the surface of a titanium substrate, the number of the steps is also increased, and therefore the manufacturing costs are increased.

SUMMARY OF THE INVENTION

An embodiment of the invention provides a manufacturing method of a separator for a fuel cell that makes it possible to reduce the manufacturing costs by reducing the number of manufacturing steps at the time of forming a carbon coating film on a titanium substrate, which has a titanium oxide layer on a surface thereof, by CVD (chemical vapor deposition).

An embodiment of the invention is a manufacturing method of a separator for a fuel cell that is a method for forming a carbon coating film on a titanium substrate, which has titanium oxide layer on a surface thereof, by means of CVD. The manufacturing method includes making a state in which the titanium substrate, which has the titanium oxide layer on the surface thereof, is placed into a vacuum atmosphere, irradiating the surface of the titanium oxide layer of the titanium substrate with light having a wavelength of equal to or shorter than 390 nm before the carbon coating film is formed or while the carbon coating film is being formed, and forming the carbon coating film on the surface of the titanium oxide layer that is irradiated with the light at the time of irradiating the surface of the titanium oxide layer of the titanium substrate with light having a wavelength of equal to or shorter than 390 nm.

When the titanium oxide ($TiO_2$) layer (oxide coating film) on the surface of the titanium substrate is irradiated with the light having the aforementioned wavelength, the titanium oxide layer is activated due to a photocatalytic effect, and the surface free energy of the titanium oxide layer is improved. As a result, the adhesion between the titanium oxide layer and the carbon coating film is improved, and accordingly, even if an intermediate layer is not disposed between the titanium oxide layer and the carbon coating as in the related art or even if the titanium oxide layer is not removed, it is possible to bring the carbon coating film into close contact with the titanium oxide layer. Consequently, a step of forming the intermediate layer for securing the adhesion between the titanium substrate and the carbon coating film or a step of removing the titanium oxide layer is not necessary, and thus the manufacturing costs can be reduced.

In the aforementioned manufacturing method, as gas for bombardment in a process of CVD, nitrogen gas-containing gas can be used.

In this case, as gas for bombardment, a gas mixture of argon gas and nitrogen gas can be used.

Furthermore, in a pretreatment step of performing pretreatment on the titanium substrate or in the step of forming the carbon coating film, light may be emitted by using plasma by adding nitrogen gas to atmosphere surrounding of the titanium substrate.

The irradiating of the surface of the titanium oxide layer of the titanium substrate with light having a wavelength of equal to or shorter than 390 nm can be performed before the carbon coating film is formed.

The manufacturing method can further include treating the surface of the titanium oxide layer of the titanium substrate with an acid, before the irradiating the surface of the titanium oxide layer of the titanium substrate with light having a wavelength of equal to or shorter than 390 nm.

The titanium oxide layer may have a rutile-type crystal structure or an anatase-type crystal structure.

Another embodiment of the invention is a manufacturing method of a separator for a fuel cell that is a method for forming a carbon coating film on a titanium substrate, which has a titanium oxide layer on a surface thereof, by CVD. The manufacturing method includes making a state in which the titanium substrate is placed into a vacuum atmosphere, performing bombarding treatment on a surface of the titanium oxide layer of the titanium substrate by using nitrogen gas-containing gas as gas for bombardment in a process of CVD, and forming the carbon coating film on the surface of the titanium oxide layer having undergone the bombarding treatment.

In the aforementioned manufacturing method, a gas mixture of nitrogen gas and argon gas can be used as gas for bombardment.

According to the embodiments of the invention, by reducing the number of manufacturing steps at the time of forming the carbon coating film on the titanium substrate, which has the titanium oxide layer on the surface thereof, by CVD, the manufacturing costs can be reduced.

BRIEF DESCRIPTION OF THE DRAWINGS

Features, advantages, and technical and industrial significance of exemplary embodiments of the invention will be described below with reference to the accompanying drawings, in which like numerals denote like elements, and wherein:

FIG. 6 is a table showing evaluation criteria used at the time of evaluating the adhesion of a carbon thin film layer with respect to a titanium oxide layer; and FIG. 7 is a table showing the contents of examples and comparative examples that are used for evaluating the adhesion of the carbon thin film layer with respect to the titanium oxide layer.

DETAILED DESCRIPTION OF EMBODIMENTS

Hereinafter, the configuration of the invention will be specifically described based on an example of embodiments shown in drawings. In the following section, for example, a case of applying the invention to a fuel cell, which is supposed to be loaded on a fuel cell vehicle, or to a fuel system including the fuel cell will be described. However, the scope of application of the invention is not limited to such a case.

Figure 1:
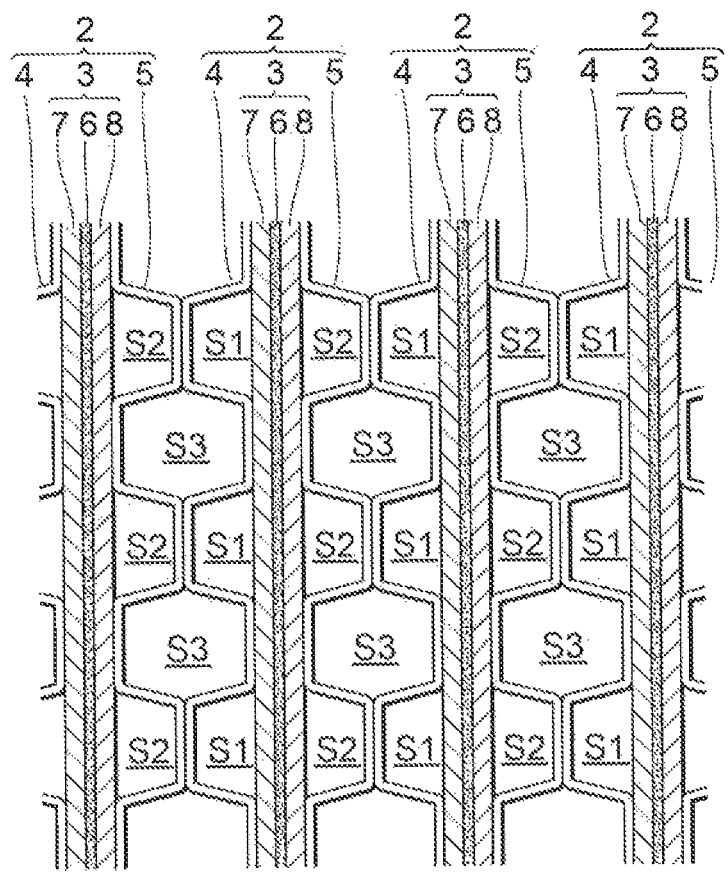
FIG. 1 is a sectional view showing main portions of a fuel cell stack including separators.

FIG. 1 is a sectional view showing main portions of a fuel cell stack. As shown in FIG. 1, in the fuel cell stack, a plurality of cells (unit cells) 2 each of which is a basic unit is laminated on each other. Each cell 2 includes an MEA (Membrane-Electrode Assembly) 3 and a pair of separators 4, 5 between which the MEA 3 is interposed. The MEA 3 includes an electrolyte membrane 6 which is composed of an ion exchange membrane and a pair of electrodes 7, 8 between which the electrolyte membrane 6 is interposed. The electrode 7 is a positive electrode through which fuel gas (for example, hydrogen gas) passes, and the electrode 8 is a negative electrode through which oxidizing gas (for example, air) passes.

Figure 2:
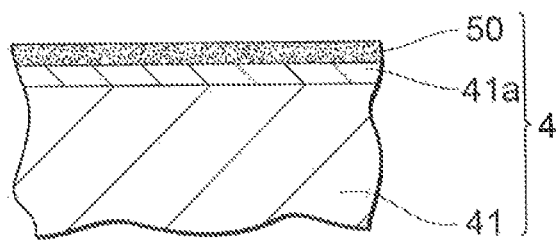
FIG. 2 is an enlarged sectional view of a separator for a fuel cell.

Both the separators 4, 5 are composed of a titanium substrate having a corrugated shape (in FIG. 2, the titanium substrate configuring the separator 4 is marked with a reference numeral 41; although the titanium substrate configuring the separator 5 is not shown in the drawing, the characteristics of the titanium substrate are the same as the characteristics of the titanium substrate 41). In the separators 4, 5, the corrugation is in the form of an isosceles trapezoid, the top of the corrugation is flat, and both ends of the top of the corrugation are angulated at an equal angle. That is, whether being seen from the front side or from the rear side, each of the separators 4, 5 has substantially the same shape. The top of the separator 4 comes into surface contact with the electrode 7 of the MEA 3, and the top of the separator 5 comes into surface contact with the electrode 8 of the MEA 3.

A space S1 formed between the electrode 7 and the separator 4 is a flowpath in which the fuel material gas circulates. A space S2 formed between the electrode 8 and the separator 5 is a flowpath in which the oxidizing gas circulates.

One cell 2 and another cell 2 adjacent thereto are disposed such that the positive electrode and the negative electrode face each other. The top on the rear surface side of the separator 4, which is disposed along a positive electrode (that is, the electrode 7) of one cell 2, and the top on the rear surface side of the separator 5, which is disposed along a negative electrode (that is, the electrode 8) of another cell 2 come into surface contact with each other. In a space S3 formed between the separators 4, 5, which come into surface contact with each other between two cells 2 adjacent to each other, water as a cooling medium that cools the cell 2 circulates.

Next, the manufacturing method of the separator 4 will be described (see FIG. 2 and the like).

Figure 3:
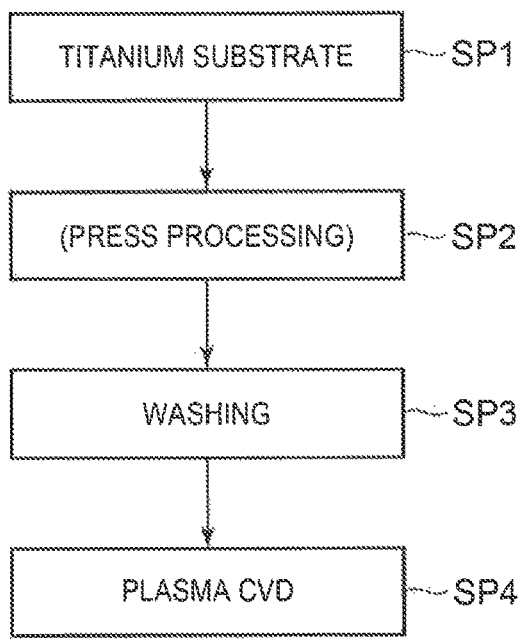
FIG. 3 is a flowchart showing the outline of manufacturing steps of a separator.

<Manufacturing Steps of Separator 4> A schematic flow of manufacturing steps of the separator 4 is shown in a drawing (see FIG. 3). As the titanium substrate configuring the separator 4, for example, a BA material (a bright annealing material) or an acid pickling material can be used (Step SP1). Both the substrates have an oxide coating film composed of titanium oxide ($TiO_2$) layer on a surface thereof. The titanium oxide layer is spontaneously formed when the titanium substrate is placed in the atmosphere. Therefore, it goes without saying that a step for forming the titanium oxide layer is not necessary.

First, as pretreatment, the titanium substrate 41 is subjected to press processing as necessary (Step SP2) and washed (Step SP3). After being washed, the titanium substrate 41 is subjected to plasma CVD (chemical vapor deposition using plasma), and a carbon thin film layer (carbon coating film) 50 that exhibits excellent adhesion is formed on a surface (a titanium oxide layer 41a) of the titanium substrate 41 (Step SP4).

Figure 4:
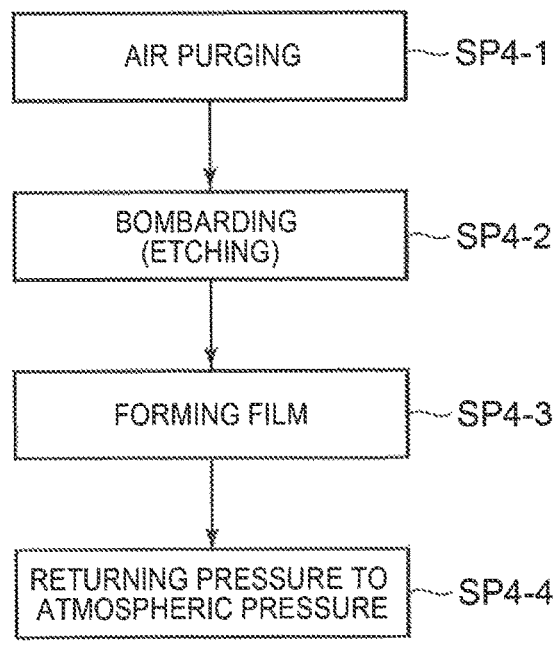
FIG. 4 is a flowchart showing the content of a process of plasma CVD.

<Process of Plasma CVD> Hereinafter, the content of the process of plasma CVD will be described (see FIG. 4). Generally, when the titanium oxide layer 41a is formed on the surface of the titanium substrate 41, the adhesion of the carbon thin film layer 50 deteriorates. Therefore, an intermediate layer is formed between the titanium oxide layer 41a and the carbon thin film layer 50 so as to improve the adhesion, or alternatively, the titanium oxide layer 41a is removed from the surface of the titanium substrate 41 by means of etching. However, in the present embodiment, through the following process, the activity of the titanium oxide layer 41a is improved, and at the same time, a film is formed by plasma CVD. In this way, excellent adhesion is ensured between the titanium oxide layer 41a and the carbon thin film layer 50.

In the process of plasma CVD, first, air purging is performed by using a vacuum apparatus, thereby making a state in which the washed titanium substrate 41 is placed in a vacuum atmosphere (Step SP4-1).

Thereafter, as a pre-step, bombarding (etching) is performed (Step SP4-2). In this step, atoms in the form of plasma are caused to physically collide with the titanium substrate 41, thereby removing a contaminant (oxide). If argon used at this time, the bombarding effect is enhanced. In the present embodiment, by using gas composition (for example, argon gas+nitrogen gas) which is different from gas composition of the bombarding treatment performed in the related art, the adhesion between the titanium oxide layer 41a and the carbon thin film layer 50 is changed.

In the present embodiment, nitrogen plasma irradiation in the step preceding the formation of a film is performed on a scale of seconds (about several seconds to ten seconds), and therefore the titanium oxide layer 41a is not removed. Furthermore, because the titanium oxide layer 41a is formed on the surface of the titanium substrate 41, nitration of the titanium substrate 41 due to nitrogen gas cannot occur in general.

Subsequently, a film is formed on the surface of the titanium oxide layer 41a (Step SP4-3). In this step, a carbon thin film is formed by using hydrocarbon-based gas (for example, acetylene) as a main ingredient. After the film is formed, the pressure is returned to atmospheric pressure (Step SP4-4).

According to the aforementioned process of plasma CVD, before the carbon thin film layer 50 is formed or while the carbon thin film layer 50 is being formed, the surface of the titanium oxide layer 41a of the titanium substrate 41 is irradiated with light having a wavelength of equal to or shorter than 390 nm. If the titanium oxide layer 41a on the surface of the titanium substrate 41 is irradiated with light having such a wavelength, due to a photocatalytic effect, the titanium oxide layer 41a is activated, and thus the surface free energy of the titanium oxide layer 41a is improved. As a result, the adhesion between the titanium oxide layer 41a and the carbon thin film layer 50 is improved, and consequently, even if an intermediate layer is not disposed between the titanium oxide layer 41a and the carbon thin film layer 50 as in the related art or even if the titanium oxide layer 41a is not removed, it is possible to bring the carbon thin film layer 50 into close contact with the surface of the titanium oxide layer 41a. Accordingly, a step of forming an intermediate layer for securing the adhesion between the titanium oxide layer 41a and the carbon thin film layer 50 or a step of removing the titanium oxide layer 41a is not necessary, and therefore the manufacturing costs can be reduced.

Figure 5:
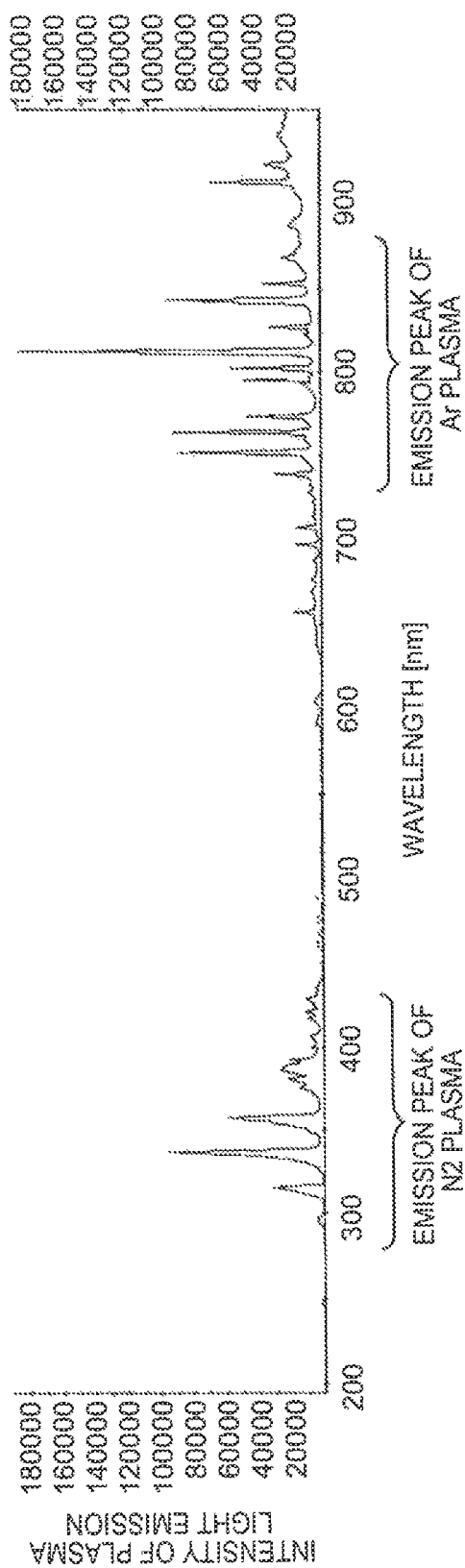
FIG. 5 is a graph showing emission peaks of plasma of nitrogen (N2) gas and argon (Ar) gas.

Hereinafter, the present embodiment will be more specifically described. Generally, a titanium oxide 10a includes three kinds of titanium oxides, and one of the two kinds of main titanium oxides is a rutile type (stable titanium oxide accounting for most of titanium oxides) and the other is an anatase type. Furthermore, the aforementioned photocatalytic effect is exhibited only after electrons and holes occurring in an excited state are provided. Herein, the energy necessary for exciting the rutile-type titanium oxide is 3.0 eV, and the energy necessary for exciting the anatase-type titanium oxide is 3.2 eV. Therefore, theoretically, the rutile-type titanium oxide is excited when being irradiated with light having a wavelength of equal to or shorter than 410 nm, and the anatase-type titanium oxide is excited when being irradiated with light having a wavelength of equal to or shorter than 390 nm, respectively. In the present embodiment in which the nitrogen gas-containing gas (for example, argon gas+nitrogen gas) is used as gas for bombardment in the process of plasma CVD, the emission peak of nitrogen (N2) plasma is equal to or shorter than 410 nm. Consequently, regardless of whether the titanium oxide 10a is a rutlie type or an anatase type, the activation of the titanium oxide layer 41a can be accelerated by a photocatalytic effect, and the surface free energy of the titanium oxide layer 41a can be improved (see FIG. 5).

The aforementioned embodiment is one of the preferred embodiments of the invention, and the invention is not limited thereto. Within a scope that does not depart from the gist of the invention, the invention can be modified in various ways.

In order to confirm the effects of the aforementioned manufacturing method, a test was performed. The test will be described below as examples (see FIG. 6 and the like).

<Type of titanium substrate> In the present example, as the titanium substrate 41, three kinds of materials including a BA material, an acid pickling material, and an anatase-type oxide film were tested. Hereinafter, each of the BA material, acid pickling material, and anatase-type oxide film will be more specifically described.

The BA material is a bright annealing material having undergone cold rolling followed by burning in an atmosphere not containing oxygen. The surface composition of the BA material contains titanium carbide in addition to titanium oxide. The titanium carbide is inevitably formed due to a reaction between rolling oil and titanium at the time of cold rolling.

The acid pickling material is a material having undergone cold rolling followed by surface etching performed mainly in nitric hydrofluoric acid. Titanium oxide accounts for most of the surface composition of the acid pickling material.

The anatase-type oxide film is generally obtained by performing cold rolling followed by anodization. Titanium oxide accounts for most of the surface of the anatase-type oxide film, and the anatase-type oxide film has an anatase-type crystal structure.

<Preparation of Sample> The titanium substrate 41 having undergone press processing was cut in an external dimension of about 200 mm×300, and the obtained sample was used as a substrate for plasma CVD. The titanium substrate 41 was used after press oil was removed by washing with hydrocarbon and an alkali performed in advance. The amount of the press oil remaining on a surface of the substrate was equal to or less than 2.25 μg/cm².

The vacuum apparatus used for forming a film was configured with two chambers including a load lock chamber and a film formation chamber. The load lock chamber is a vacuum chamber provided for preventing the film formation chamber (reaction chamber) from being opened to the atmosphere. The load lock chamber is separated from the film formation chamber by a gate valve and includes a substrate transport mechanism. In the substrate transport mechanism, the substrate which has not yet been treated or has been treated is put into or taken out of the chamber, and in this way, the vacuum state of the film formation chamber can be maintained.

First, the sample of the titanium substrate 41 was set such that the periphery thereof is supported by a discharge jig, and put into the load lock chamber. Thereafter, air purging was started, and from this point, the step was started. As soon as a vacuum pressure reached 10 Pa, the workpiece was heated to about 300° C. by being heated from the outside by means of lamp heating (an example of a simple heating mode using heat of a lamp), thereby removing oil that remained on the surface of the workpiece. Thereafter, the gate valve between the load lock chamber and the film formation chamber was opened, and the workpiece was put into the film formation chamber so as to form a film.

The film formation chamber was preheated to 300° C., and a film was formed at a pressure of 10 Pa. At this time, as a result of measuring the amount of moisture in the film formation chamber by Q-mass, an outcome of $1.0 \times 10^{-8}$ Amp·s was obtained (the amount of moisture was about $10^{-3}$ Pa in terms of a partial pressure). This signified that moisture remained in the vacuum formed by the aforementioned vacuum apparatus.

After the workpiece was put into the film formation chamber, a bias contact was connected to the jig such that a bias voltage of −2.5 kV or −2.0 kV was applied to the workpiece by DC, thereby generating glow discharge plasma between the workpiece and positive electrodes. The positive electrodes were disposed such that they were parallel to the workpiece and face both surfaces of the workpiece, and the plasma was simultaneously generated on both surfaces of the workpiece. Furthermore, in order to increase plasma density, a magnet made of samarium cobalt is disposed in the chamber such that the electrons generated by the plasma were captured by the magnet.

The process of generating plasma was performed in the order of voltage increase, bombardment, and film formation, and all of these steps were performed in a state in which the pressure was controlled to become 10 Pa. For pressure control, an APC (automatic pressure controller) was used. The same species of gas was used for the voltage increase and bombardment, which had a gas composition containing argon as a main ingredient. During the film formation, a carbon-based thin film was formed by using hydrocarbon-based gas as a main ingredient. The thickness of the formed thin film was 50 mm.

<Method for evaluating adhesion> A test specimen was cut into a 100 mm×50 mm piece and then subjected to a peeling test by using a pressure cooker (manufactured by HIRAYAMA MANUFACTURING CORP). At this time, the test specimen was exposed to vapor of pure water such that peeling was accelerated. The test was performed under the condition in which the test specimen was exposed to saturated water vapor with a temperature of 130° C., was left as is for 1 hour and then cooled, and was taken out of the pressure cooker.

For evaluating peeling, by SEM (scanning electron microscopy), a degree of surface peeling was observed and classified according to the criteria relating to each of a proportion of a peeled area and a rate of resistance increase (see FIG. 6). Furthermore, at this time, by measuring contact resistance, the increase in resistance resulting from peeling of the film was confirmed. The proportion of a peeled area observed by SEM was roughly calculated through visual observation performed by a measurer.

Examples and Comparative Examples

A portion of various examples, in which the substrate, bias voltage, and flow rate of Ar/N are appropriately changed in a case of using a gas mixture of "argon gas+ nitrogen gas" as a gas species for bombardment, is shown as Examples 1 to 7 (see FIG. 7). Furthermore, a portion of examples, in which the substrate and bias voltage are appropriately changed in a case of using "argon gas" as a gas species for bombardment (in this case, a flow rate of nitrogen gas in the Ar/N flow rate of the gas for bombardment is 0) is shown as Comparative examples 1 to 5 (see FIG. 7).

The substrate, the bias voltage, the gas species for bombardment, the Ar/N flow rate of the gas for bombardment, the maximum temperature at the time of bombardment, the presence or absence of N2 gas during the film formation, and the result of the adhesion evaluation in each of examples and comparative examples are shown in a table (see FIG. 7). Each of the symbols in the column indicating the result of adhesion evaluation means the following. A (very good): a proportion of a peeled area is equal to or less than 1%, B (good): a proportion of a peeled area is equal to or less than 5%, C (average): a proportion of a peeled area is equal to or less than 20%, D (poor): other than the above.

In addition, by measuring contact resistance, the increase in resistance resulting from the peeling of the film was confirmed. In the examples and comparative examples that were evaluated to be A, B, and C in terms of adhesion, the rate of resistance increase was equal to or less than 20%, and in the examples and comparative examples that were evaluated to be D in terms of adhesion, the rate of resistance increase was other than the above (that is, the rate of resistance increase was greater than 20%).

The invention is suitable for being applied at the time of forming carbon coating film on a titanium substrate, which has a titanium oxide layer on the surface thereof, by CVD (chemical vapor deposition).

What is claimed is:

1. A manufacturing method of a fuel cell separator comprising a titanium substrate that is a method for forming a carbon coating film on the titanium substrate, which has a titanium oxide layer on a surface of the titanium substrate, by chemical vapor deposition (CVD), comprising:
   making a state in which the titanium substrate, which has the titanium oxide layer on the surface of the titanium substrate, is placed into a vacuum atmosphere;
   irradiating a surface of the titanium oxide layer of the titanium substrate with light having a wavelength of equal to or shorter than 390 nm for ten seconds or less such that the titanium oxide layer is not removed before the carbon coating film is formed; and
   forming the carbon coating film on the surface of the titanium oxide layer that is irradiated with light at the time of the irradiating of the surface of the titanium oxide layer of the titanium substrate with light having a wavelength of equal to or shorter than 390 nm.

2. The manufacturing method according to claim 1, wherein nitrogen gas-containing gas is used as gas for bombardment used in the process of CVD.

3. The manufacturing method according to claim 1, wherein a gas mixture of argon gas and nitrogen gas is used as gas for bombardment in the process of CVD.

4. The manufacturing method according to claim 1, wherein in a pretreatment step of performing pretreatment on the titanium substrate or in a step of forming the carbon coating film, light is emitted by using plasma by adding nitrogen gas to a surrounding of the titanium substrate.

5. The manufacturing method according to claim 1, wherein the surface of the titanium substrate is treated with an acid before the irradiating of the surface of the titanium oxide layer of the titanium substrate with light having a wavelength of equal to or shorter than 390 nm.

6. The manufacturing method according to claim 1, wherein the titanium oxide layer has a rutile-type crystal structure or an anatase-type crystal structure.

7. A manufacturing method of a fuel cell separator comprising a titanium substrate that is a method for forming a carbon coating film on the titanium substrate, which has a titanium oxide layer on a surface of the titanium substrate, by chemical vapor deposition (CVD), comprising:
- making a state in which the titanium substrate is placed into a vacuum atmosphere;
- performing bombarding treatment on a surface of the titanium oxide layer of the titanium substrate by using nitrogen gas-containing gas as gas for bombardment in a process of CVD for ten seconds or less such that the titanium oxide layer is not removed; and
- forming the carbon coating film on the surface of the titanium oxide layer having undergone the bombarding treatment.

8. The manufacturing method according to claim 7, wherein a gas mixture of nitrogen gas and argon gas is used as gas for bombardment.

\* \* \* \* \*